United States Patent
Matsuda et al.

(10) Patent No.: US 9,943,911 B2
(45) Date of Patent: Apr. 17, 2018

(54) SURFACE-COATED BORON NITRIDE SINTERED BODY TOOL

(71) Applicant: Sumitomo Electric Hardmetal Corp., Itami-shi (JP)

(72) Inventors: Yusuke Matsuda, Itami (JP); Katsumi Okamura, Itami (JP); Kenta Sano, Itami (JP); Nozomi Tsukihara, Itami (JP); Makoto Setoyama, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 103 days.

(21) Appl. No.: 14/899,908

(22) PCT Filed: Mar. 20, 2015

(86) PCT No.: PCT/JP2015/058475
§ 371 (c)(1),
(2) Date: Dec. 18, 2015

(87) PCT Pub. No.: WO2015/163059
PCT Pub. Date: Oct. 29, 2015

(65) Prior Publication Data
US 2016/0136735 A1    May 19, 2016

(30) Foreign Application Priority Data

Apr. 25, 2014 (JP) ................. 2014-091727

(51) Int. Cl.
*B23B 27/14* (2006.01)
*C04B 41/00* (2006.01)
(Continued)

(52) U.S. Cl.
CPC ........ *B23B 27/148* (2013.01); *C04B 35/5831* (2013.01); *C04B 35/6261* (2013.01);
(Continued)

(58) Field of Classification Search
USPC .......... 51/307, 309; 428/216, 336, 325, 697, 428/698, 699
See application file for complete search history.

(56) References Cited

U.S. PATENT DOCUMENTS 6,316,094 B1    11/2001    Fukaya et al.
2002/0045072 A1    4/2002    Kukino et al.
(Continued)

FOREIGN PATENT DOCUMENTS

CN    1347784 A    5/2002
CN    1813078 A    8/2006
(Continued)

OTHER PUBLICATIONS

Extended European Search Report in counterpart European Patent Application No. 15783371.6, dated Dec. 7, 2016.
(Continued)

*Primary Examiner* — Archene Turner
(74) *Attorney, Agent, or Firm* — Venable LLP; Michael A. Sartori; Kerri M. Patterson

(57) ABSTRACT

A surface-coated boron nitride sintered body tool is provided, in which a cutting edge portion includes a compound sintered body and a coating layer. The compound sintered body includes cBN particles. The compound sintered body includes 45-80 vol % of cBN particles. A first particle size distribution curve of the cBN particles has one or more peaks in a range in which a particle size is 0.1-0.7 μm. A second particle size distribution curve of the cBN particles has a first peak having a maximum peak height in a range in which the particle size is 2.0-7.0 μm. An integral value ratio ($I_o/I_t \times 100$) is 1-20, in the second particle size distribution curve, the integral value $I_o$ being in the range in which the particle size is 0.1-0.7 μm, and the integral value $I_t$ being in an entire range.

5 Claims, 1 Drawing Sheet

(51) Int. Cl.
- *C04B 41/50* (2006.01)
- *C04B 41/52* (2006.01)
- *C04B 41/89* (2006.01)
- *C04B 35/5831* (2006.01)
- *C23C 14/00* (2006.01)
- *C23C 14/02* (2006.01)
- *C23C 14/06* (2006.01)
- *C23C 14/32* (2006.01)
- *C04B 35/626* (2006.01)
- *C04B 35/63* (2006.01)
- *C04B 35/645* (2006.01)
- *C22C 26/00* (2006.01)

(52) U.S. Cl.
CPC .... *C04B 35/62645* (2013.01); *C04B 35/6303* (2013.01); *C04B 35/645* (2013.01); *C04B 41/009* (2013.01); *C04B 41/5063* (2013.01); *C04B 41/5068* (2013.01); *C04B 41/52* (2013.01); *C04B 41/89* (2013.01); *C23C 14/0021* (2013.01); *C23C 14/022* (2013.01); *C23C 14/0641* (2013.01); *C23C 14/325* (2013.01); *B23B 2224/24* (2013.01); *B23B 2226/125* (2013.01); *B23B 2228/105* (2013.01); *C04B 2235/3813* (2013.01); *C04B 2235/3865* (2013.01); *C04B 2235/3886* (2013.01); *C04B 2235/5436* (2013.01); *C04B 2235/5445* (2013.01); *C04B 2235/661* (2013.01); *C04B 2235/783* (2013.01); *C04B 2235/785* (2013.01); *C04B 2235/786* (2013.01); *C04B 2235/80* (2013.01); *C04B 2235/9607* (2013.01); *C22C 26/00* (2013.01)

(56) References Cited

U.S. PATENT DOCUMENTS

| | | | |
|---|---|---|---|
| 2004/0002418 A1* | 1/2004 | Scurlock | B23B 27/148 501/96.4 |
| 2005/0003239 A1 | 1/2005 | Derflinger et al. | |
| 2009/0056232 A1* | 3/2009 | Can | C04B 35/5831 51/307 |
| 2009/0080986 A1 | 3/2009 | Can et al. | |
| 2009/0181238 A1* | 7/2009 | Can | C04B 35/5831 428/325 |
| 2013/0000213 A1* | 1/2013 | Okamura | C04B 35/5831 51/307 |
| 2013/0079215 A1 | 3/2013 | Okamura et al. | |
| 2013/0108850 A1 | 5/2013 | Kudo et al. | |
| 2014/0165474 A1* | 6/2014 | Yee | C04B 35/5831 51/307 |

FOREIGN PATENT DOCUMENTS

| | | |
|---|---|---|
| CN | 101084169 A | 12/2007 |
| CN | 102821898 A | 12/2012 |
| EP | 1780186 A2 | 5/2007 |
| EP | 2168702 A1 | 3/2010 |
| EP | 2446987 A1 | 5/2012 |
| EP | 2559504 A1 | 2/2013 |
| EP | 2591869 A1 | 5/2013 |
| JP | 63-145726 A | 6/1988 |
| JP | 2000-044347 A | 2/2000 |
| JP | 2000-044350 A | 2/2000 |
| JP | 20000-044348 * | 2/2000 |
| JP | 2000-247746 A | 9/2000 |
| JP | 2008-528413 A | 7/2008 |
| WO | 2006/046125 A1 | 5/2006 |
| WO | WO-2012/005275 A1 | 1/2012 |
| WO | WO-2014/034923 A1 | 3/2014 |

OTHER PUBLICATIONS

International Search Report in PCT International Application No. PCT/JP2015/058475, dated May 19, 2015.

Notification of the First Office Action in counterpart Chinese Patent Application No. 201580001120.6, dated Sep. 29, 2016.

* cited by examiner

US 9,943,911 B2

SURFACE-COATED BORON NITRIDE SINTERED BODY TOOL

TECHNICAL FIELD

The present invention relates to a surface-coated boron nitride sintered body tool, in which at least a cutting edge portion includes a compound sintered body including cubic boron nitride particles and binder particles, and a coating layer provided on the surface of the compound sintered body.

BACKGROUND ART

Since cubic boron nitride (which may be hereinafter referred to as "cBN") is the highest hardness substance next to a diamond, it is used for various kinds of cutting tools and the like. Such cBN is generally used as a compound sintered body together with a binder, rather than used alone.

Recently, a work material and cutting conditions have been diversified in terms of applications to a cutting tool, which leads to a high level of demands made for a cutting tool using cBN. Particularly, it is desired to improve wear resistance and breakage resistance.

For example, Japanese Patent Laying-Open No. 2000-044350 (PTD 1) discloses that the crater wear resistance of the cutting tool is improved by using cBN particles having an average grain size of 2 μm or more and 6 μm or less. Japanese Patent Laying-Open No. 2000-044347 (PTD 2) discloses that the breakage resistance of the cutting tool is improved by using cBN particles having an average grain size of 0.01 μm or more and less than 2.0 μm.

CITATION LIST

Patent Document

PTD 1: Japanese Patent Laying-Open No. 2000-044350
PTD 2: Japanese Patent Laying-Open No. 2000-044347

SUMMARY OF INVENTION

Technical Problem

In the recent hardened steel component processing, one worker or a small number of workers is/are often forced to concurrently take charge of a plurality of machines for the purpose of reducing labor costs. Thus, the characteristics required for the tool has been changing to "reliability" so as to allow stabilized processing. However, even if the cutting tool disclosed in PTD 1 or PTD 2 is used, the compound sintered body is broken or the surface roughness of the processed surface of the processing target is deteriorated, so that the tool life is not stabilized. Accordingly, the above-mentioned required characteristics cannot be satisfied.

Accordingly, in consideration of the above-described circumstances, it is aimed to provide a surface-coated boron nitride sintered body tool, by which the tool life can be stabilized and lengthened even when processing of hardened steel or the like is carried out.

Solution to Problem

A surface-coated boron nitride sintered body tool according to one embodiment of the present invention is provided, in which at least a cutting edge portion includes a compound sintered body and a coating layer provided on a surface of the compound sintered body. The compound sintered body includes cubic boron nitride particles and binder particles. The compound sintered body includes 45 vol % or more and 80 vol % or less of cubic boron nitride particles. In a case where a particle size distribution of the cubic boron nitride particles in at least one cross section of the compound sintered body is shown by a first particle size distribution curve plotted by a horizontal axis that is divided in each prescribed particle size range and a vertical axis that shows a proportion of the number of particles in each particle size range, the first particle size distribution curve has one or more peaks in a range in which a particle size is 0.1 μm or more and 0.7 μm or less. In a case where the particle size distribution of the cubic boron nitride particles in at least one cross section of the compound sintered body is shown by a second particle size distribution curve plotted by a horizontal axis that is divided in each prescribed particle size range and a vertical axis that shows a proportion of an area occupied by particles in each particle size range, the second particle size distribution curve has a first peak having a maximum peak height in a range in which the particle size is 2.0 μm or more and 7.0 μm or less. An integral value ratio $(I_o/I_t \times 100)$ between an integral value $I_o$ and an integral value $I_t$ is 1 or more and 20 or less, wherein, in the second particle size distribution curve, integral value $I_o$ is in the range in which the particle size is 0.1 μm or more and 0.7 μm or less, and integral value $I_t$ is in an entire range. The coating layer includes an A layer that is in contact with the surface of the compound sintered body, and a B layer provided on the A layer. The A layer is made of $Al_{1-s}Cr_sN$ (0.2≤s≤0.9). The B layer is made of $Ti_{1-t}Al_tN$ (0.3≤t≤0.8). The A layer has a thickness of 0.05 μm or more and 0.5 μm or less. The B layer has a thickness of 0.2 μm or more and 5 μm or less. The coating layer has an entire thickness of 0.3 μm or more and 7 μm or less.

Advantageous Effects of Invention

According to the above description, the tool life can be stabilized and lengthened even when processing of hardened steel or the like is carried out.

DESCRIPTION OF EMBODIMENTS

Figure 1:
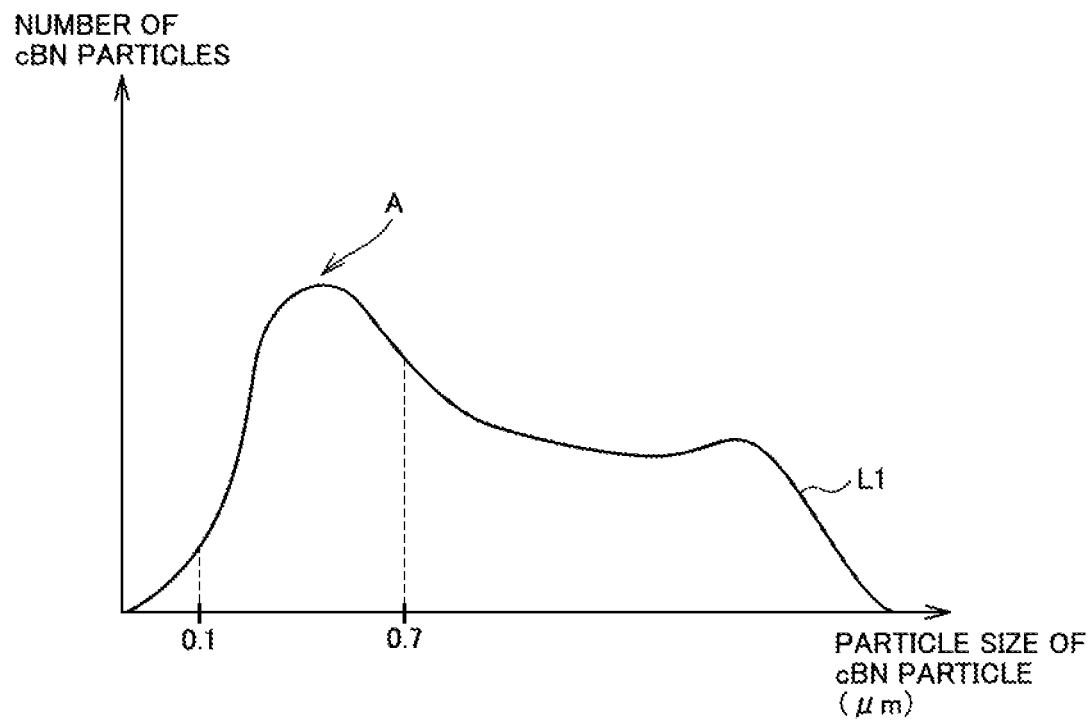
FIG. 1 is a graph schematically showing the first particle size distribution curve of cBN particles of a compound sintered body.

The present inventors considered that, if processing of hardened steel or the like is performed using a tool including a compound sintered body that is excellent in toughness and strength, the compound sintered body can be prevented from being broken. The expression that "the compound sintered body can be prevented from being broken" used herein means that cracking is less likely to occur and spread in the compound sintered body.

In the compound sintered body, the binder is lower in strength than cBN. Accordingly, cracking is more likely to occur in a region where binder particles exist in the aggregated state (a binder phase), and also, more likely to spread through the binder phase. The present inventors considered that, if the particle size of each cBN particle is decreased, cBN particles are uniformly dispersed in the compound sintered body, so that aggregation of the binder particles in the compound sintered body may be able to be prevented.

It is known that cBN reacts with a binder containing Ti (for example, TiN, TiCN or the like) in a high-temperature heat treatment and the like to generate $TiB_2$. It is presumed that, when the particle size of each cBN particle is too small, the cBN particles would disappear by the above-described reaction, thereby leading to production of $TiB_2$ particles. In this case, $TiB_2$ is lower in strength than the binder containing Ti. According to the above, if the particle size of each cBN particle is too small, the low strength region is to expand on the contrary in the compound sintered body, so that the strength of the compound sintered body is lowered. Also, if the particle size of each cBN particle is small, the toughness of the compound sintered body is lowered.

On the other hand, if the particle size of each cBN particle is large, the toughness of the compound sintered body can be enhanced, so that cracking in the compound sintered body can be prevented from spreading. However, if the particle size of each cBN particle is too large, the cBN particles are less likely to disperse in the compound sintered body, which consequently leads to aggregation of the binder particles in the compound sintered body.

As a result of having conducted earnest studies in view of the results described above, the present inventors have found that, if the particle size distribution of the cBN particles is optimized, the compound sintered body can be prevented from being broken even when processing of hardened steel or the like is carried out.

Furthermore, if the coating layer and the compound sintered body are not firmly bonded to each other (if the adhesiveness between the coating layer and the compound sintered body is relatively low), film peeling or abnormal wear is to occur during cutting. As a result of having repeatedly conducted many experiments, the present inventors have found that the particle size distribution of the cBN particles in the compound sintered body and the composition of the coating layer correlate with the above-described adhesiveness (the adhesiveness between the coating layer and the compound sintered body), which will be hereinafter specifically described.

DESCRIPTION OF EMBODIMENTS OF THE PRESENT INVENTION

First, the embodiments of the present invention will be hereinafter listed for description.

[1] A surface-coated boron nitride sintered body tool according to one embodiment of the present invention is provided, in which at least a cutting edge portion includes a compound sintered body and a coating layer provided on a surface of the compound sintered body. The compound sintered body includes cubic boron nitride particles and binder particles. The compound sintered body includes 45 vol % or more and 80 vol % or less of cubic boron nitride particles. In a case where a particle size distribution of the cubic boron nitride particles in at least one cross section of the compound sintered body is shown by a first particle size distribution curve plotted by a horizontal axis that is divided in each prescribed particle size range and a vertical axis that shows a proportion of the number of particles in each particle size range, the first particle size distribution curve has one or more peaks in a range in which a particle size is 0.1 μm or more and 0.7 μm or less. In a case where the particle size distribution of the cubic boron nitride particles in at least one cross section of the compound sintered body is shown by a second particle size distribution curve plotted by a horizontal axis that is divided in each prescribed particle size range and a vertical axis that shows a proportion of an area occupied by particles in each particle size range, the second particle size distribution curve has a first peak having a maximum peak height in a range in which the particle size is 2.0 μm or more and 7.0 μm or less. An integral value ratio ($I_o/I_t \times 100$) between an integral value $I_o$ and an integral value $I_t$ is 1 or more and 20 or less. In the second particle size distribution curve, integral value $I_o$ is in the range in which the particle size is 0.1 μm or more and 0.7 μm or less, and integral value $I_t$ is in an entire range. The coating layer includes an A layer that is in contact with the surface of the compound sintered body, and a B layer provided on the A layer. The A layer is made of $Al_{1-s}Cr_sN$ ($0.2 \leq s \leq 0.9$). The B layer is made of $Ti_{1-t}Al_tN$ ($0.3 \leq t \leq 0.8$). The A layer has a thickness of 0.05 μm or more and 0.5 μm or less. The B layer has a thickness of 0.2 μm or more and 5 μm or less. The coating layer has an entire thickness of 0.3 μm or more and 7 μm or less.

According to this surface-coated boron nitride sintered body tool, since the particle size distribution of the cBN particles is optimized as described above in the compound sintered body, the toughness and the strength of the compound sintered body can be enhanced, so that the breakage resistance of the compound sintered body can be improved. In addition to the above, since the coating layer is configured as described above, the adhesiveness between the coating layer and the compound sintered body can be increased, so that occurrence of film peeling and abnormal wear during cutting can be suppressed. Therefore, the surface roughness of the processed surface of the work material can be improved. According to the above, in the case where processing of hardened steel or the like is carried out using the above-described surface-coated boron nitride sintered body tool, the compound sintered body can be prevented from being broken while occurrence of film peeling and abnormal wear during cutting can be prevented, with the result that the tool life can be stabilized and lengthened.

[2] It is preferable that the compound sintered body includes 65 vol % or more and 75 vol % or less of cubic boron nitride particles. It is preferable that the integral value ratio ($I_o/I_t \times 100$) is 1 or more and 7 or less. Thereby, the strength of the compound sintered body can be further enhanced.

[3] In an X-ray diffraction spectrum of the compound sintered body, it is preferable that a peak height ratio ($I_{TiB2}/I_{cBN} \times 100$) of a peak height $I_{TiB2}$ of a peak belonging to a (101) plane of $TiB_2$ to a peak height $I_{cBN}$ of a peak belonging to a (111) plane of the cubic boron nitride particle is 10 or more and 25 or less. Since it is considered that the amount of produced $TiB_2$ is suppressed to be relatively small in such a compound sintered body, expansion of the low strength region can be further prevented.

[4] It is preferable that the binder particles have an average particle size of 50 nm or more and 500 nm or less. Thereby, a compound sintered body having further excellent toughness and strength can be provided.

[5] In the case where a thermal conductivity of the compound sintered body is defined as X (W/m·K) and a volume content of the cubic boron nitride particles in the compound sintered body is defined as Y (vol %), it is preferable that X/Y is 1.2 or more. Thereby, occurrence of crater wear in the compound sintered body can be suppressed, so that the strength of the cutting edge of the compound sintered body can be maintained.

Details of Embodiments of the Present Invention

The embodiments of the present invention (which will be hereinafter referred to as the "present embodiments") will be hereinafter described in greater detail.

<Configuration of Surface-Coated Boron Nitride Sintered Body Tool>

At least a cutting edge portion of the surface-coated boron nitride sintered body tool of the present embodiment includes a compound sintered body containing cBN particles and binder particles, and a coating layer provided on the surface of the compound sintered body.

According to the surface-coated boron nitride sintered body tool of the present embodiment, the compound sintered body includes 45 vol % or more and 80 vol % or less of cBN particles. If the compound sintered body includes 45 vol % or more of cBN particles, the strength of the compound sintered body can be enhanced. If the compound sintered body includes 80 vol % or less of cBN particles, the volume content of the binder particles in the compound sintered body can be ensured, so that the bonding strength of the cBN particles by the binder particles can be ensured. Therefore, the strength of the compound sintered body can be enhanced.

FIG. 1 is a graph schematically showing the first particle size distribution curve of the cBN particles in the compound sintered body included in the surface-coated boron nitride sintered body tool of the present embodiment. According to the surface-coated boron nitride sintered body tool of the present embodiment, in the case where the particle size distribution of the cBN particles in at least one cross section of the compound sintered body is shown by a first particle size distribution curve L1 plotted by a horizontal axis that is divided in each prescribed particle size range and a vertical axis that shows a proportion of the number of particles in each particle size range, first particle size distribution curve L1 of the cBN particles has one or more peaks A in the range in which the particle size is 0.1 μm or more and 0.7 μm or less. Thereby, since the cBN particles are uniformly dispersed in the compound sintered body, aggregation of the binder particles can be prevented, so that the low strength region can be prevented from expanding. Furthermore, in the compound sintered body, disappearance of cBN particles can be prevented even when a reaction occurs between the cBN particles and the binder particles containing Ti. This also can prevent expansion of the low strength region. According to the above, occurrence of cracking in the compound sintered body can be prevented.

Figure 2:
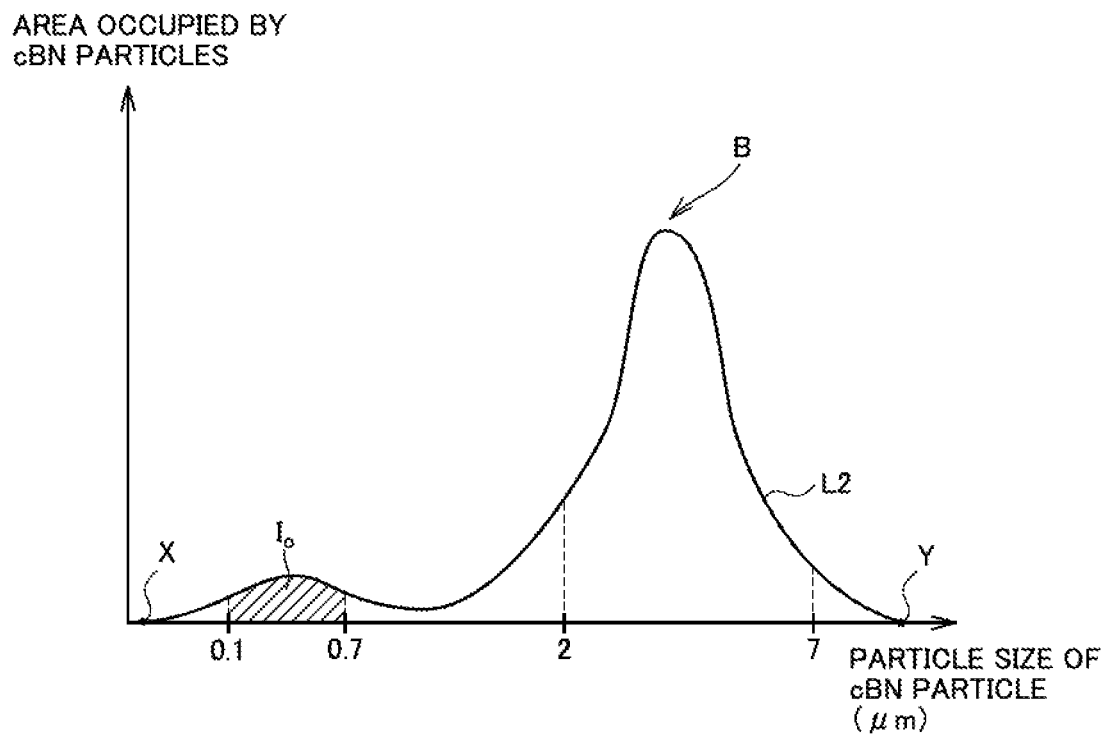
FIG. 2 is a graph schematically showing the second particle size distribution curve of the cBN particles of the compound sintered body.

FIG. 2 is a graph schematically showing the second particle size distribution curve of the cBN particles in the compound sintered body included in the surface-coated boron nitride sintered body tool of the present embodiment. According to the surface-coated boron nitride sintered body tool of the present embodiment, in the case where the particle size distribution of the cBN particles in at least one cross section of the compound sintered body is shown by a second particle size distribution curve L2 plotted by a horizontal axis that is divided in each prescribed particle size range and a vertical axis that shows a proportion of an area occupied by particles in each particle size range, second particle size distribution curve L2 of the cBN particles has a first peak B having a maximum peak height in the range in which the particle size is 2.0 μm or more and 7.0 μm or less. Thereby, many coarse cBN particles exist in the compound sintered body. Accordingly, even when cracking occurs in the compound sintered body, cracking is prevented from spreading by these coarse cBN particles. In the case where second particle size distribution curve L2 of the cBN particles has a first peak B that appears in a range in which the particle size is greater than 7.0 μm, in the compound sintered body, cBN particles are less likely to disperse on the contrary, so that the binder particles are more likely to aggregate, with the result that the low strength region is more likely to expand. In the case where second particle size distribution curve L2 of the cBN particles has a first peak B that appears in a range in which the particle size is smaller than 2.0 μm, cracking is not prevented from spreading, so that the life resistant to breakage is shortened.

According to the surface-coated boron nitride sintered body tool of the present embodiment, an integral value ratio ($I_o/I_t \times 100$) between an integral value $I_o$ and an integral value $I_t$ is 1 or more and 20 or less, wherein in second particle size distribution curve L2, integral value $I_o$ is in the range in which the particle size is 0.1 μm or more and 0.7 μm or less, and integral value $I_t$ is in the entire range. Thereby, the content of the fine-grain cBN particles can be ensured in the compound sintered body, so that aggregation of the binder particles can be prevented, with the result that expansion of the low strength region can be prevented.

According to the surface-coated boron nitride sintered body tool of the present embodiment, since the particle size distribution of the cBN particles in the compound sintered body is optimized as described above, the strength of the compound sintered body can be increased while cracking in the compound sintered body can be prevented from occurring and spreading. Namely, in the present embodiment, the toughness and the strength of the compound sintered body can be improved. Therefore, the breakage resistance of the compound sintered body can be increased.

Furthermore, according to the surface-coated boron nitride sintered body tool of the present embodiment, a coating layer is provided on the surface of the above-described compound sintered body. The coating layer includes an A layer that is in contact with the surface of the compound sintered body, and a B layer provided on the A layer. The A layer is made of $Al_{1-s}Cr_sN$ ($0.2 \le s \le 0.9$). The B layer is made of $Ti_{1-t}Al_tN$ ($0.3 \le t \le 0.8$). The A layer has a thickness of 0.05 μm or more and 0.5 μm or less. The B layer has a thickness of 0.2 μm or more and 5 μm or less. The coating layer has an entire thickness of 0.3 μm or more and 7 μm or less. Since the coating layer has such a configuration, the adhesiveness between the coating layer and the compound sintered body can be increased, so that occurrence of film peeling and abnormal wear during cutting can be prevented. Therefore, the surface roughness of the processed surface of the work material can be improved.

As described above, in the case where processing of hardened steel or the like is carried out using the surface-coated boron nitride sintered body tool of the present embodiment, a breakage of the compound sintered body can be prevented while occurrence of film peeling and abnormal wear during cutting can be prevented. Therefore, the tool life can be stabilized and lengthened.

In addition, since the surface-coated boron nitride sintered body tool of the present embodiment has a basic configuration as described above, it can be used particularly effectively in machining (for example, cutting processing) of a sintered alloy and hard-to-cut cast iron or in processing of hardened steel, and also can be suitably used in various types of processing of common metal other than the above.

<Configuration of Compound Sintered Body>

The compound sintered body of the present embodiment includes cBN particles and binder particles. Such a compound sintered body may include other components as long as it includes cBN particles and binder particles, and also can include inevitable impurities (for example, $TiB_2$) resulting from the used raw material, the manufacturing conditions, and the like. Furthermore, in the compound sintered body of the present embodiment, cBN particles may be connected to each other to form a continuous structure or binder particles may be connected to each other to form a continuous structure.

<cBN Particles>

The compound sintered body includes 45 vol % or more and 80 vol % or less of cBN particles (as described above), and preferably, includes 65 vol % or more and 75 vol % or less of cBN particles. If the compound sintered body includes 65 vol % or more and 75 vol % or less of cBN particles, the strength of the compound sintered body can be further enhanced.

In the present specification, the volume content of the cBN particles in the compound sintered body is calculated in accordance with the method described below. First, the compound sintered body is mirror-polished, and a photograph of the backscattered electron image of the compound sintered body structure in an arbitrary region is taken by a scanning electron microscope (which will be hereinafter abbreviated as "SEM") at 2000 times magnification. In this case, the cBN particles are observed as a black area while the binder particles are observed as a gray area or a white area. Then, the obtained photograph of the compound sintered body structure is subjected to image processing to achieve binarization of the cBN particles and the binder particles, to calculate the occupancy area of the cBN particles. Then, the calculated occupancy area of the cBN particles is substituted into the following equation, thereby obtaining the volume content of the cBN particles in the compound sintered body.

(Volume content of cBN particles in compound sintered body)=(occupancy area of cBN particles)÷(entire area of photographed compound sintered body structure)×100.

<First Particle Size Distribution Curve and Second Particle Size Distribution Curve of cBN Particles>

First particle size distribution curve L1 of the cBN particles has one or more peaks A in the range in which the particle size is 0.1 μm or more and 0.7 μm or less (as described above). Furthermore, second particle size distribution curve L2 of the cBN particles has a first peak B having a maximum peak height in the range in which the particle size is 2.0 μm or more and 7.0 μm or less (as described above). Furthermore, in second particle size distribution curve L2, the integral value ratio ($I_o/I_t \times 100$) is 1 or more and 20 or less (as described above), and preferably, 1 or more and 7 or less. If the integral value ratio ($I_o/I_t \times 100$) is 1 or more and 7 or less, the content of the coarse cBN particles can be further ensured in the compound sintered body, so that the strength of the compound sintered body can be further enhanced.

In the present specification, first particle size distribution curve L1 and second particle size distribution curve L2 of the cBN particles in the compound sintered body are calculated in accordance with the method as described below. First, a focused ion beam system (FIB), a cross section polisher (CP) or the like is used to produce an observation sample. The entire observation sample is observed by using the SEM at 500 times magnification. Then, a view (region) where cBN particles are averagely dispersed is selected, and this region is further observed at 2000 times magnification.

Then, the SEM image of the selected region is subjected to image processing to achieve binarization of the cBN particles and the binder particles. In addition, in the above-described SEM image, the cBN particles are observed as a black area while the binder particles are observed as a gray area or a white area. Furthermore, image processing is employed to separate the portion where black areas are continuously observed due to the cBN particles coming into contact with each other.

Then, image analysis software is used to calculate a circle equivalent diameter based on the area per cBN particle (a diameter of the circle in the case where the shape of the cBN particle is assumed to be a circle having this area), to produce the first particle size distribution curve (in the first particle size distribution curve, the vertical axis shows the proportion of the number of particles in each particle size range). In this case, the horizontal axis of the first particle size distribution curve is divided at intervals at a distance such that $Log_{10}$ (the particle size of a cBN particle) is equal to about 0.037. Then, the area is calculated from the calculated circle equivalent diameter to produce the second particle size distribution curve (in the second particle size distribution curve, the vertical axis shows a proportion of the area of the particles in each particle size range).

In the present specification, the "peak" includes not only a peak having only one top point (maximum value) (a peak having a unimodal shape), but also a peak having n (n is an integer) top points and (n−1) valley portions (minimum value) (a peak having a multi-modal shape).

In the case where first peak B has a multi-modal shape, the expression that "the second particle size distribution curve has the first peak having a maximum peak height in the range in which the particle size is 2.0 μm or more and 7.0 μm or less" means that the peak height at one of two or more top points included in first peak B is the maximum in second particle size distribution curve L2 of the cBN particles.

Furthermore, the expression that "the second particle size distribution curve has a first peak having a maximum peak height in the range in which the particle size is 2.0 μm or more and 7.0 μm or less" means that the top point included in first peak B appears in the range in which the particle size is 2.0 μm or more and 7.0 μm or less, and also includes the case where a part of the skirt of first peak B extends to a range in which the particle size is less than 2.0 μm or a range in which the particle size is greater than 7.0 μm.

In first particle size distribution curve L1 of the cBN particles, the "peak height" means a value on the vertical axis at the top point included in peak A. In second particle size distribution curve L2 of the cBN particles, the "peak height" means a value on the vertical axis at the top point included in first peak B.

An integral value $I_o$ in the range in which the particle size is 0.1 μm or more and 0.7 μm or less means the area of a portion, in the range in which the particle size is 0.1 μm or more and 0.7 μm or less, that is surrounded by second particle size distribution curve L2 of the cBN particles and the horizontal axis of the second particle size distribution of the cBN particles. Similarly, an integral value $I_t$ in the entire range means the area of a portion surrounded by second particle size distribution curve L2 of the cBN particles and the horizontal axis of the second particle size distribution of the cBN particles. For example, in the case shown in FIG. 2, integral value $I_t$ in the entire range means the area of a portion, in the range in which the particle size is not less than the particle size of each cBN particle at a point X and not more than the particle size of each cBN particle at a point Y, that is surrounded by second particle size distribution curve L2 of the cBN particles and the horizontal axis of the second particle size distribution of the cBN particles. In this case, point X and point Y each are an intersection of second particle size distribution curve L2 of the cBN particles and the horizontal axis of the second particle size distribution of the cBN particles. The methods of calculating integral value $I_o$ and integral value $I_t$ are not particularly limited.

First particle size distribution curve L1 of the cBN particles may further have one or more peaks in the range in which the particle size is less than 0.1 μm or in the range in which the particle size is greater than 0.7 μm. According to the present embodiment, even if such a peak appears in first particle size distribution curve L1 of the cBN particles, the above-described effects can be achieved without being influenced thereby.

Furthermore, second particle size distribution curve L2 of the cBN particles may further have one or more peaks in the range in which the particle size is great than 0.7 μm and less than 2.0 μm. Furthermore, if the peak height is sufficiently low, second particle size distribution curve L2 of the cBN particles may further have one or more peaks in the range in which the particle size is less than 0.1 μm, or may further have one or more peaks in the range in which the particle size is great than 7 μm. In the present embodiment, even if such a peak appears in second particle size distribution curve L2 of the cBN particles, the above-described effects can be achieved without being influenced thereby.

<Binder Particle>

Binder particles are not particularly limited as long as they exhibit an action of coupling cBN particles to one another, and any binder particle having a conventionally known composition that is known as a binder particle of the compound sintered body can be employed. It is preferable that the binder particle is, for example; a particle made of a compound containing at least one element of group 4 elements (Ti, Zn, Hf or the like), group 5 elements (V, Nb, Ta or the like) and group 6 elements (Cr, Mo, W or the like) in the element periodic table, and at least one element of C, N, B, and O; a particle made of a solid solution of such a compound; or a particle made of an aluminum compound. The binder particle may be a particle made of two or more of the above-described compound; a solid solution of the above-described compound; and an aluminum compound.

It is preferable that the binder particles have an average particle size of 50 nm or more and 500 nm or less. If the binder particles have an average particle size of 50 nm or more, the bonding strength of the cBN particles by the binder particles can be ensured, so that the strength of the compound sintered body can be further enhanced. If the binder particles have an average particle size of 500 nm or less, expansion of the low strength region can be further prevented in the compound sintered body, so that cracking can be further prevented from occurring and spreading. According to the above, if the binder particles have an average particle size of 50 nm or more and 500 nm or less, the toughness and the strength of the compound sintered body is further enhanced. Accordingly, even when processing of hardened steel or the like is carried out, the compound sintered body can be further prevented from being broken.

In the present specification, the average particle size of the binder particles is calculated in accordance with the method as described below. Specifically, an observation sample is produced in accordance with the same method as that of calculating the first particle size distribution curve and the second particle size distribution curve of the cBN particles. Then, the entire observation sample is observed by using the SEM at low magnification to select, from the obtained backscattered electron image of the SEM, a portion where the binder particles are averagely dispersed. Then, the selected portion is further observed at 50000 times magnification. The obtained image is subjected to image processing to achieve binarization of the cBN particles and the binder particles. Then, image analysis software is used to calculate a circle equivalent diameter based on the area per binder particle (a diameter of the circle in the case where the shape of the binder particle is assumed to be a circle having the area). The average value of the calculated circle equivalent diameters is defined as an average particle size of the binder particles.

<X-Ray Diffraction Spectrum of Compound Sintered Body>

In the X-ray diffraction spectrum of the compound sintered body, it is preferable that the peak height ratio ($I_{TiB2}/I_{cBN} \times 100$) of a peak height $I_{TiB2}$ of the peak belonging to a (101) plane of $TiB_2$ (an example of the inevitable impurities contained in the compound sintered body) to a peak height $I_{cBN}$ of the peak belonging to a (111) plane of the cBN particle is 10 or more and 25 or less. It is considered that, if the peak height ratio ($I_{TiB2}/I_{cBN} \times 100$) is 25 or less, the amount of $TiB_2$ produced by the reaction of the cBN particles and the binder particles containing Ti is suppressed to be small. Therefore, according to such a compound sintered body, expansion of the low strength region can be further prevented, so that cracking can be further prevented from occurring and spreading. If the peak height ratio ($I_{TiB2}/I_{cBN} \times 100$) is 10 or more, $TiB_2$ generated between the cBN particles and the binder particles serves to enhance the bonding strength between these particles, so that the breakage resistance of the compound sintered body is further increased. According to the above, if the peak height ratio ($I_{TiB2}/I_{cBN} \times 100$) is 10 or more and 25 or less, the compound sintered body can be further prevented from being broken even when processing of hardened steel or the like is carried out. More preferably, the peak height ratio ($I_{TiB2}/I_{cBN} \times 100$) is 15 or more and 20 or less.

In the present specification, the X-ray diffraction spectrum of the compound sintered body is measured using an X-ray diffractometer under the conditions as described below.

X-ray light source: Cu-Kα ray (having a wavelength of 1.54060 Å)

Scan step: 0.02°

Scan axis: 2θ

Scan range: 20° to 60°.

In the case where the peak belonging to the (111) plane of the cBN particle has a multi-modal shape, the expression of "peak height $I_{cBN}$ of the peak belonging to the (111) plane of the cBN particle" means the peak height at the highest top point of the plurality of top points included in the peak. Similarly, in the case where the peak belonging to the (101) plane of $TiB_2$ has a multi-modal shape, the expression of "peak height $I_{TiB2}$ of the peak belonging to the (101) plane of $TiB_2$" means the peak height at the highest top point of the plurality of top points included in the peak. Furthermore, in the X-ray diffraction spectrum of the compound sintered body, the "peak height" means the magnitude of the diffraction intensity at the top point included in the peak.

In the case where the value on the vertical axis in the skirt of the peak shows a positive value in the X-ray diffraction spectrum of the compound sintered body, the above-mentioned "peak height" means the peak height after a background correction. The method for this background correction can be a method that is conventionally known as a method for a background correction made to the X-ray diffraction spectrum. For example, a background correction may be made to the entire X-ray diffraction spectrum of the compound sintered body, or may be made only to a specific peak (for example, the peak belonging to the (111) plane of the cBN particle or the peak belonging to the (101) plane of $TiB_2$).

<Relation Between Thermal Conductivity of Compound Sintered Body and Volume Content of cBN Particles>

In the case where the thermal conductivity of the compound sintered body is defined as X (W/m·K) and the volume content of the cBN particles in the compound sintered body is defined as Y (vol %), it is preferable that X/Y is 1.2 or more. If X/Y is 1.2 or more, occurrence of the crater wear in the compound sintered body is suppressed, so that the strength of the cutting edge of the compound sintered body can be maintained. More preferably, X/Y is 1.3 or more.

In the present specification, the thermal conductivity of the compound sintered body can be calculated from: the specific heat and density of the compound sintered body; and the thermal diffusivity of the compound sintered body that is measured by the laser flash method or by a xenon flash thermal diffusion apparatus.

<Use of Compound Sintered Body>

The compound sintered body of the present embodiment can be used for various types of tools including a cutting tool and also be useful as various types of industrial materials. Particularly in the case where a cutting tool at least partially including the compound sintered body of the present embodiment is used, the effects of the present embodiment are effectively exhibited.

Examples of such a cutting tool can be a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, a tap, a pin-milling processing tip of a crankshaft, and the like.

The compound sintered body of the present embodiment, which is used for a cutting tool as described above, is not limited only to the case where this compound sintered body forms the entire configuration of the tool, but may form only a part thereof (particularly, a cutting edge part and the like), and for example may be applied to the case where only the cutting edge part of the base member made of cemented carbide or the like is formed of a compound sintered body of the present embodiment.

<Configuration of Coating Layer>

The coating layer includes: an A layer that is in contact with the surface of the compound sintered body; and a B layer provided on the A layer (as described above). The coating layer of the present embodiment may include any other layers except the A layer and the B layer as long as it includes these A and B layers. Such other layers may be provided between the A layer and the B layer. Furthermore, the A layer and the B layer may be alternately stacked in the coating layer of the present embodiment.

The coating layer has an entire thickness of 0.3 μm or more and 7 μm or less (as described above). If the coating layer has an entire thickness of 0.3 μm or more, the wear resistance of the surface-coated boron nitride sintered body tool can be improved. If the coating layer has a thickness of 7 μm or less, the chipping resistance of the coating layer in the early stage of cutting can be improved. Preferably, the coating layer has an entire thickness of 0.7 μm or more and 3 μm or less. In this case, the entire thickness in the expression of "the coating layer has an entire thickness" means the distance from the interface between the coating layer and the compound sintered body to the surface of the coating layer located on the side opposite to this interface.

In the present specification, the thickness of the entire coating layer, the thickness of the A layer and the number of stacked A layers, and the thickness of the B layer and the number of stacked B layers each were obtained by observing a cross section, which was obtained by cutting the surface-coated boron nitride sintered body tool, with a SEM or a transmission electron microscope (TEM). Furthermore, the composition of each of the A layer and the B layer was measured using an energy dispersive X-ray spectrometry attached to the SEM or the TEM.

Although the coating layer only has to be provided only in the cutting edge portion of the surface-coated boron nitride sintered body tool, it may cover the entire surface of the base member of the surface-coated boron nitride sintered body tool, or may not be provided in a part of the portion different from the cutting edge portion. Furthermore, the stacking configuration of a part of the coating layer may be partially different in a portion different from the cutting edge portion.

<A Layer>

The A layer is made of $Al_{1-s}Cr_sN$ (0.2≤s≤0.9). Thereby, the adhesiveness between the compound sintered body and the coating layer can be increased, so that the chipping resistance of the surface-coated boron nitride sintered body tool can be increased. The above-mentioned condition is preferably 0.2≤s≤0.8.

Specifically, since the A layer contains Al, $AlB_2$, AlN, TiAlN or the like is produced in the interface between the compound sintered body and the A layer. In the case where the A layer is rich in Al (0.2≤s≤0.5), $AlB_2$, AlN, TiAlN or the like is more likely to be produced in the interface between the compound sintered body and the A layer. Therefore, since the affinity between the A layer and each of the cBN particles and the binder particles is increased, the adhesiveness between the compound sintered body and the A layer can be increased. Furthermore, the adhesiveness between the A layer and the B layer can also be increased, thereby consequently allowing the B layer to cover the compound sintered body with excellent adhesiveness.

In addition to the above, the A layer, which contains Cr, is higher in hardness than the B layer, so that this A layer is to have a mechanical property similar to that of the compound sintered body. This also can increase the adhesiveness between the compound sintered body and the A layer. Furthermore, the lattice constant of the A layer shows a value that is close to the lattice constant of the compound sintered body. This also can increase the adhesiveness between the compound sintered body and the A layer.

Cr has a composition s that may be uniform in the A layer, or may increase or decrease in a step-like manner or in a slope-like manner from the compound sintered body-side toward the surface-side of the A layer (for example, the B layer-side).

The A layer has a thickness of 0.05 μm or more and 0.5 μm or less. If the A layer has a thickness of 0.05 μm or more, the adhesiveness between the compound sintered body and the coating layer can be further increased. Therefore, the chipping resistance of the surface-coated boron nitride sintered body tool can be further increased. If the A layer has a thickness of 0.5 μm or less, the wear resistance of the coating layer can be increased. Preferably, the A layer has a thickness of 0.05 μm or more and 0.3 μm or less.

<B Layer>

The B layer is made of $Ti_{1-t}Al_tN$ (0.3≤t≤0.8). Thereby, the coating layer that is excellent in balance between the hardness and the Young's modulus can be provided, so that the wear resistance and the chipping resistance of the surface-coated boron nitride sintered body tool can be increased. Preferably, the above-mentioned condition is $0.4 \leq t \leq 0.7$.

Al has a composition t that may be uniform in the B layer, or may increase or decrease in a step-like manner or in a slope-like manner from the A layer-side toward the surface-side of the B layer (for example, the surface-side of the tool).

The B layer has a thickness of 0.2 µm or more and 5 µm or less. If the B layer has a thickness of 0.2 µm or more, the wear resistance of the coating layer can be increased. If the B layer has a thickness of 5 µm or less, the chipping resistance and the peeling resistance of the B layer can be increased. The thickness of the B layer is preferably 0.5 µm or more and 3 µm or less, and more preferably, 0.7 µm or more and 2.0 µm or less.

<Manufacture of Surface-Coated Boron Nitride Sintered Body Tool>

The method of manufacturing a surface-coated boron nitride sintered body tool of the present embodiment includes, for example, the steps of: manufacturing a compound sintered body; preparing a base member having a compound sintered body provided at least in a cutting edge portion; and forming a coating layer at least on a surface of the compound sintered body. The step of preparing a base member preferably further includes the step of bonding the compound sintered body to a base member main body having a prescribed shape.

<Manufacture of Compound Sintered Body>

It is preferable that the method of manufacturing a compound sintered body includes the steps of: mixing raw material powder of cBN and raw material powder of a binder; and sintering the mixture.

In the step of mixing raw material powder of cBN and the raw material powder of a binder, the raw material powder of cBN and the raw material powder of the binder are uniformly mixed, and then, molded into a desired shape. The conditions for mixing the raw material powder of cBN and the raw material powder of the binder can be those conventionally known as conditions for mixing the raw material powder of cBN and the raw material powder of the binder. The same also applies to the method of obtaining a molded body (a method of molding a mixture of the raw material powder of cBN and the raw material powder of a binder). For example, the method of filling up a capsule made of Mo (molybdenum) or the like can be used.

In the step of sintering the obtained mixture, it is preferable that the obtained mixture (molded body) is held at a temperature of about 1300° C. to 1800° C. at pressure of about 5 GPa to 7 GPa for about 10 to 60 minutes. More preferably, during the above-mentioned sintering, the mixture is heated to a temperature of 500° C. or higher and 700° C. or lower, and then, pressurized. Thereby, pressurization progresses in the state where the pressure medium is softened, so that it becomes possible to reduce collapse due to pressure applied by the cBN particles coming into contact with each other during pressurization. Therefore, the cBN particles having the above-described particle size distribution can be stably obtained.

<Formation of Coating Layer>

It is preferable that the step of forming a coating layer includes the step of forming a coating layer by the arc ion plating method (the ion plating method for evaporating a solid material by utilizing vacuum are discharge) or by the sputtering method.

According to the arc ion plating method, a coating layer can be formed using: a metal evaporation source containing metal species for forming a coating layer; and reaction gas such as $CH_4$, $N_2$, $O_2$ or the like. The conditions for forming a coating layer by the arc ion plating method can be those known as conditions for forming the coating layer of the surface-coated boron nitride sintered body tool by the are ion plating method.

According to the sputtering method, a coating layer can be formed using: a metal evaporation source containing metal species for forming a coating layer, reaction gas such as $CH_4$, $N_2$, $O_2$ or the like, and sputtering gas such as Ar, Kr, Xe, or the like. The conditions for forming a coating layer by the sputtering method can be those known as conditions for forming a coating layer of the surface-coated boron nitride sintered body tool by the sputtering method.

More preferably, the method of manufacturing a surface-coated boron nitride sintered body tool of the present embodiment includes the step of, before the step of forming a coating layer, etching the surface of the base member on which a coating layer is to be formed. By this etching, only the binder particles of the compound sintered body included in the above-described surface of the base member are selectively removed.

In the case where only the coarse cBN particles are included as cBN particles in the compound sintered body, many of binder particles are removed by the above-described etching from the above-described surface of the base member, so that large projections and recesses are formed on the above-described surface of the base member. Accordingly, in the coating layer formed on the above-described surface of the base member, the crystal particle size becomes unequal, and also, a crystal having a relatively large particle size is formed.

On the other hand, in the compound sintered body of the present embodiment, the particle size distribution of the cBN particles is optimized as described above, so that projections and recesses formed on the above-described surface of the base member can be suppressed to be small. In addition to this, since $Al_{1-s}C_sN$ that is a material of the A layer is not epitaxially grown on the cBN particles, the A layer having a microscopic structure is to be uniformly formed on the surface of the compound sintered body. Therefore, the coating layer that is excellent in strength can be formed.

EXAMPLES

Although the present invention will be hereinafter described in greater detail with reference to Examples, the present invention is not limited thereto.

Examples 1 to 5 and Comparative Examples 1 and 2

Manufacture of Compound Sintered Body

First, $Ti_UN_V$ (where U=1, V=0.6) powder (having an average particle size of 2.0 µm) and Al powder (having an average particle size of 20 µm) were uniformly mixed in a mass ratio of 80:20. Then, this powder mixture was heat-treated in a vacuum using a vacuum furnace for 30 minutes at 1200° C. Then, the powder mixture having been heat-treated as described above was ground using a ball mill formed of a pot made of cemented carbide and a ball made of cemented carbide, thereby obtaining raw material powder for binders.

Then, the raw material powder of the cBN described above and the raw material powder for the binders described above were uniformly mixed by the above-described ball mill such that the blending proportion of the raw material powder of cBN became equal to the value shown in Table 1.

Then, the obtained powder mixture was held for 20 minutes at 900° C. in the vacuum furnace, and thereby, degassed. The degassed powder mixture was introduced into a capsule made of molybdenum (Mo). First, an ultra-high pressure apparatus was used to raise the temperature to 500° C., and after that, apply pressure up to 3 GPa, and then, held for 2 minutes under such pressure and temperature conditions.

Then, the ultra-high pressure apparatus was used to again apply pressure up to 6.5 GPa and simultaneously raise the temperature to 1650° C., and then, held for further 15 minutes under such pressure and temperature conditions, thereby performing sintering. In this way, a compound sintered body was obtained. The obtained compound sintered body was then subjected to measurements as described below.

<Measurement of First Particle Size Distribution Curve and Second Particle Size Distribution Curve of cBN Particles>

First, an observation sample was produced using CP. The entire observation sample was observed by using an SEM (manufactured by JEOL Ltd.; product number "JSM7600F") at 500 times magnification under the observation conditions as described below. The region where cBN particles were averagely dispersed was selected and observed at 2000 times magnification. A backscattered electron detector (LABE) was used as a detector.

<Observation Conditions>
Accelerating voltage: 2 kV
Aperture: 6 μm
Observation mode: GB mode (Gentle Beam mode).

Then, the SEM image in the selected region was subjected to image processing to thereby achieve binarization of the cBN particles (a black area) and the binder particles (a gray area or a white area). In addition, image processing was employed to separate the portion where the black areas were continuously observed due to the cBN particles coming into contact with each other.

Then, image analysis software (Win roof) was used to calculate a circle equivalent diameter based on the area per cBN particle to produce the first particle size distribution curve. In this case, the horizontal axis of the first particle size distribution curve was divided at intervals at a distance such that $Log_{10}$ (the particle size of a cBN particle) became equal to about 0.037. Then, the area was calculated from the calculated circle equivalent diameter to produce the second particle size distribution curve. Then, the integral value ratio $(I_o/I_x \times 100)$ was calculated.

<Measurement of Average Particle Size of Binder Particles>

An observation sample was produced in accordance with the same method as that of measuring the first particle size distribution curve and the second particle size distribution curve of the cBN particles. Then, the entire observation sample was observed by using the SEM at low magnification to select, from the obtained backscattered electron image of the SEM, a portion where the binder particles were averagely dispersed. Then, the selected portion was further observed at 50000 times magnification. The obtained SEM image was subjected to image processing to achieve binarization of the cBN particles and the binder particles. Then, image analysis software (Win roof) was used to calculate a circle equivalent diameter based on the area per binder particle. The average value of the calculated circle equivalent diameters was defined as an average particle size of the binder particles.

<Measurement of X-Ray Diffraction Spectrum>

The X-ray diffraction spectrum of the compound sintered body was measured under the conditions as described below.

X-ray light source: Cu-Kα ray (having a wavelength of 1.54060 Å)
Scan step: 0.02°
Scan axis: 2θ
Scan area: 20° to 60°.

After the obtained X-ray diffraction spectrum was entirely subjected to a background correction, the peak height ratio $(I_{TiB2}/I_{cBN} \times 100)$ was calculated.

<Calculation of Thermal Conductivity X/Volume Content Y of cBN Particles>

The thermal diffusivity of the compound sintered body was measured by the laser flash method. Then, based on the measured thermal diffusivity and the specific heat and density of the compound sintered body, thermal conductivity X of the compound sintered body was calculated.

Furthermore, the compound sintered body was mirror-polished, and a photograph of the backscattered electron image of the compound sintered body structure in an arbitrary region was taken by an electron microscope at 2000 times magnification. Then, the obtained photograph of the compound sintered body structure was subjected to image processing (using Win roof as image analysis software) to achieve binarization of the cBN particles (a black area) and the binder particles (a white area or a gray area), to calculate the occupancy area of the cBN particles. Then, the obtained occupancy area of the cBN particles was substituted into the following equation to calculate a volume content Y of the cBN particles in the compound sintered body. Then, X/Y was calculated.

(Volume content $Y$ of cBN particles in compound sintered body)=(occupancy area of cBN particles)÷(entire area of photographed compound sintered body structure)×100.

<Manufacture of Base Member>

The manufactured compound sintered body was brazed to a base member made of cemented carbide and molded into a prescribed shape (SNGA120408 of the ISO standard). In this way, the base member having a cutting edge portion formed of a compound sintered body was obtained.

<Etching to Surface of Base Member on which Coating Layer is to be Formed>

The above-described surface of the base member was subjected to etching within a film forming apparatus. A vacuum pump is connected to the film forming apparatus, within which a vacuum chamber that can be evacuated is provided. A rotary table is placed inside the vacuum chamber. This rotary table is configured such that the base member can be placed thereon through a jig. The base member placed within the vacuum chamber can be heated by a heater placed inside the vacuum chamber. Also, a gas pipe for introducing gas for etching and film forming is connected to the vacuum chamber through a mass flow controller (MFC) for flow rate control. Furthermore, within the vacuum chamber, a tungsten filament for generating Ar ions for etching is disposed, and an arc evaporation source or a sputtering source for film formation to which a necessary power supply is connected is disposed. Then, evaporation source raw material (target) required for film formation is placed in the arc evaporation source or the sputtering source.

The manufactured base member was placed within the above-described vacuum chamber of the above-described film forming apparatus, and the vacuum chamber was evacuated. Then, the base member was heated to 500° C. while rotating the rotary table at 3 rpm. Then, Ar gas was introduced into the vacuum chamber, the above-mentioned tungsten filament was discharged to generate Ar ions, a bias voltage was applied to the base member, and then, the surface of the base member (the surface of the base member on which a coating layer was to be formed) was etched by Ar ions. The etching conditions in this case were as described below.

Pressure of Ar gas: 1 Pa
Substrate bias voltage: −500V.
<Formation of A Layer>

An A layer was formed on the above-described surface of the base member within the above-described film forming apparatus. Specifically, the A layer ($Al_{1-s}Cr_sN$ (s is 0.2)) was formed while adjusting the vapor deposition time so as to have a thickness of 0.4 μm under the conditions described below.

Target: containing 80 atom % of Al and 20 atom % of Cr
Introduced gas: $N_2$
Film forming pressure: 4 Pa
Arc discharge current: 150 A
Substrate bias voltage: −35V
Table rotation speed: 3 rpm.
<Formation of B Layer>

Then, a B layer was formed on the A layer within the above-described film forming apparatus. Specifically, the B layer ($Ti_{1-t}Al_tN$ (t is 0.7)) was formed while adjusting the vapor deposition time so as to have a thickness of 1.5 μm under the conditions described below. In this way, the surface-coated boron nitride sintered body tool (which may be hereinafter referred to as a "cutting tool") was obtained.

Target: containing 30 atom % of Ti and 70 atom % of Al
Introduced gas: $N_2$
Film forming pressure: 4 Pa
Arc discharge current: 150 A
Substrate bias voltage: −35V
Table rotation speed: 3 rpm.
<Measurement of Interrupted Cutting Life>

The obtained cutting tool was used to perform a cutting test of performing high-speed strong interrupted cutting under the following conditions, to obtain the tool life (interrupted cutting life) until a breakage reached 0.1 mm or more.

Work material: carburized and hardened steel SCM415H, HRC62
(100 mm in diameter×300 mm in length, five V-shaped grooves provided in the axial direction of the work material)
Cutting speed: V=130 m/min.
Feed rate: f=0.1 mm/rev.
Cutting depth: d=0.5 mm
Wet type/dry type: dry type.

The results thereof are shown in Table 1. The longer interrupted cutting life means that the compound sintered body can be more prevented from being broken even when processing of hardened steel or the like is performed. In the present embodiment, it is considered that, when the interrupted cutting life is 3 km or more, the compound sintered body is prevented from being broken even when processing of hardened steel or the like is performed.

<Measurement of Continuous Cutting Life>

The obtained cutting tool was used to perform a cutting test of performing high-speed strong interrupted cutting under the following conditions, to obtain the tool life (continuous cutting life) until the flank face maximum wear reached 0.1 mm or more.

Work material: carburized and hardened steel SCM415H HRC62
(100 mm in diameter×300 mm in length)
Cutting speed: V=200 m/min.
Feed rate: f=0.1 mm/rev.
Cutting depth: d=0.2 mm
Wet type/dry type: wet type.

The results thereof are shown in Table 1. The longer continuous cutting life means that the wear resistance of the compound sintered body is higher even when processing of hardened steel or the like is performed. In the present embodiment, it is considered that, when the continuous cutting life is 9 km or more, wear of the compound sintered body can be suppressed even when processing of hardened steel or the like is performed.

<Evaluation of Peeling Resistance>

The obtained cutting tool was used to perform cutting processing (a cutting distance: 3 km) under the cutting conditions as described below. Then, an optical microscope was used to measure the peeled area and the flank face wear amount of the coating layer.

Work material: high hardness steel SCM415H (HRC60)
(35 mm in diameter×10 mm in length)
Cutting speed: V=150 m/min.
Feed rate: f=0.1 mm/rev.
Cutting depth: ap=0.1 mm
Cutting oil: 20-fold diluted emulsion (trade name: "System Cut 96" manufactured by Japan Fluid Power System Society) (wet state).

The smaller peeled area of the coating layer means that the adhesiveness between the compound sintered body and the coating layer is higher. In the present embodiment, it is determined that the adhesiveness between the compound sintered body and the coating layer is high when the peeled area of the coating layer is 7000 μm$^2$ or less. Furthermore, the smaller flank face wear amount means that the cutting tool is more excellent in flank face wear resistance. In the present embodiment, it is determined that the cutting tool is excellent in flank face wear resistance when the flank face wear amount is 80 mm or less.

Examples 6 to 8 and Comparative Examples 3 and 4

In each of Examples 6 to 8 and Comparative Example 4, the cutting tool was obtained in accordance with the method described in the above Example 1 and the like except that the raw material powder of cBN was selected so as to achieve the particle size shown in the column of "cBN Particle Size (μm)$^{*02}$" in Table 1. The manufactured cutting tool was used to measure the interrupted cutting life and the continuous cutting life, and then, evaluate the peeling resistance.

In Comparative Example 3, when a compound sintered body was manufactured, the powder mixture (powder mixture of the raw material powder of cBN and the raw material powder for binders) introduced into a capsule was pressurized to a pressure of 6.5 GPa using a ultra-high pressure apparatus, and thereafter, heated to a temperature of 1650° C., and then, held for 15 minutes under such pressure and temperature conditions. Except for the above, the cutting tool was manufactured in accordance with the method described in the above Example 1 and the like. The manufactured cutting tool was used to measure the interrupted cutting life and the continuous cutting life, and then, evaluate the peeling resistance.

Examples 9 to 12 and Comparative Examples 5 and 6

In each of Examples 9 to 12 and Comparative Examples 5 and 6, the cutting tool was obtained in accordance with the method described in the above Example 1 and the like except that the mixing ratio (mass ratio) between the raw material powder of coarse cBN and the raw material powder of fine-grain cBN was changed. The manufactured cutting tool was used to measure the interrupted cutting life and the continuous cutting life, and then, evaluate the peeling resistance.

Examples 13 to 16

In each of Examples 13 to 16, a cutting tool including binder particles having an average particle size of a value shown in Table 1 was used to measure the interrupted cutting life and the continuous cutting life, and then, evaluate the peeling resistance.

Examples 17 to 22

In each of Examples 17 to 22, a cutting tool having a peak height ratio ($I_{TiB2}/I_{cBN} \times 100$) of a value shown in Table 1 was used to measure the interrupted cutting life and the continuous cutting life, and then, evaluate the peeling resistance.

<Results and Consideration>

TABLE 1

| | | Compound Sintered Body cBN Particle | | | |
|---|---|---|---|---|---|
| | | | First Particle Size Distribution | Second Particle Size Distribution Curve | |
| | No. | Volume Content (vol %) | Curve Occurrence or Non-occurrence of Peak*[01] | cBN Particle Size (μm)*[02] | Integral Value Ratio ($l_o/l_I \times 100$) |
| Example | 1 | 80 | Occurred | 5 | 3 |
| | 2 | 75 | Occurred | 5 | 3 |
| | 3 | 70 | Occurred | 5 | 3 |
| | 4 | 65 | Occurred | 5 | 3 |
| | 5 | 45 | Occurred | 5 | 3 |
| Comparative Example | 1 | 85 | Occurred | 5 | 3 |
| | 2 | 40 | Occurred | 5 | 3 |
| Example | 6 | 70 | Occurred | 2 | 3 |
| | 7 | 70 | Occurred | 4 | 3 |
| | 8 | 70 | Occurred | 7 | 3 |
| Comparative Example | 3 | 70 | Occurred | 0.1 | 3 |
| | 4 | 70 | Occurred | 10 | 3 |
| Example | 9 | 70 | Occurred | 5 | 1 |
| | 10 | 70 | Occurred | 5 | 4 |
| | 11 | 70 | Occurred | 5 | 7 |
| | 12 | 70 | Occurred | 5 | 20 |
| Comparative Example | 5 | 70 | Not Occurred | 5 | 0.1 |
| | 6 | 70 | Occurred | 5 | 30 |
| Example | 13 | 70 | Occurred | 5 | 3 |
| | 14 | 70 | Occurred | 5 | 3 |
| | 15 | 70 | Occurred | 5 | 3 |
| | 16 | 70 | Occurred | 5 | 3 |
| Example | 17 | 70 | Occurred | 5 | 3 |
| | 18 | 70 | Occurred | 5 | 3 |
| | 19 | 70 | Occurred | 5 | 3 |
| | 20 | 70 | Occurred | 5 | 3 |
| | 21 | 70 | Occurred | 5 | 3 |
| | 22 | 70 | Occurred | 5 | 3 |

| | | Compound Sintered Body | | | Evaluation of Tool Life | |
|---|---|---|---|---|---|---|
| | No. | Binder Particle Average Particle Size (nm) | Peak Height Ratio ($I_{IBC}/I_{cBN} \times 100$) | X/Y*[03] | Interrupted Cutting Life (km) | Continuous Cutting Life (km) |
| Example | 1 | 300 | 14 | 1.39 | 5 | 9 |
| | 2 | 300 | 17 | 1.35 | 4.8 | 12 |
| | 3 | 300 | 17 | 1.26 | 4.5 | 12.4 |
| | 4 | 300 | 16 | 1.21 | 4.4 | 12.6 |
| | 5 | 300 | 20 | 1.11 | 3 | 14 |
| Comparative Example | 1 | 300 | 14 | 1.39 | 5.3 | 3 |
| | 2 | 300 | 22 | 1.12 | 0.2 | 14.2 |
| Example | 6 | 300 | 17 | 1.2 | 5 | 12.1 |
| | 7 | 300 | 17 | 1.24 | 5.1 | 12.4 |
| | 8 | 300 | 16 | 1.3 | 4.8 | 12.5 |
| Comparative Example | 3 | 300 | 17 | 1.09 | 1.7 | 12.2 |
| | 4 | 300 | 16 | 1.34 | 1.9 | 12.4 |
| Example | 9 | 300 | 16 | 1.22 | 4.6 | 12.1 |
| | 10 | 300 | 17 | 1.21 | 4.9 | 11.5 |
| | 11 | 300 | 17 | 1.2 | 5.3 | 10.4 |
| | 12 | 300 | 17 | 1.1 | 4 | 10 |

TABLE 1-continued

| | | | | | | |
|---|---|---|---|---|---|---|
| Comparative | 5 | 300 | 15 | 1.22 | 2.2 | 11.8 |
| Example | 6 | 300 | 19 | 1.01 | 2 | 9.3 |
| Example | 13 | 50 | 17 | 1.2 | 4.6 | 11.5 |
| | 14 | 500 | 18 | 1.23 | 4.5 | 12 |
| | 15 | 20 | 17 | 1.19 | 3.7 | 9 |
| | 16 | 700 | 17 | 1.24 | 3.9 | 12.2 |
| Example | 17 | 300 | 10 | 1.23 | 3.8 | 12.7 |
| | 18 | 300 | 15 | 1.22 | 4.3 | 12.3 |
| | 19 | 300 | 20 | 1.24 | 4.8 | 12.2 |
| | 20 | 300 | 25 | 1.23 | 5 | 11.9 |
| | 21 | 300 | 5 | 1.22 | 3.2 | 13 |
| | 22 | 300 | 30 | 1.22 | 5 | 10.1 |

In Table 1, the column of "Occurrence or Non-occurrence of Peak[*01]" shows whether the first particle size distribution curve of cBN particles has a peak or not in the range in which the particle size is 0.1 μm or more and 0.7 μm or less. In this column, "Occurred" means that the first particle size distribution curve of cBN particles has one or more peaks in the range in which the particle size is 0.1 μm or more and 0.7 μm or less. In this column, "Not Occurred" means that the first particle size distribution curve of cBN particles does not have any peak in the range in which the particle size is 0.1 μm or more and 0.7 μm or less.

Further in Table 1, the column of "cBN Particle Size (μm)[*02]" shows the particle size (μm) of the cBN particle at the top point included in the first peak appearing in the second particle size distribution curve of the cBN particles.

Further in Table 1, the column of "X/Y[*03]" shows (thermal conductivity X of compound sintered body)/(volume content Y of cBN particles in compound sintered body).

In each of Examples 1 to 5, the interrupted cutting life was 3 km or more, and the continuous cutting life was 9 km or more. On the other hand, in Comparative Example 1, the continuous cutting life was less than 9 km. In Comparative Example 2, the interrupted cutting life was less than 3 km. It turned out from the above-described results that, when the compound sintered body includes 45 vol % or more and 80 vol % or less of cBN particles, the compound sintered body can be prevented from being broken and suppressed from wearing even when processing of hardened steel or the like is performed.

Also in each of Examples 2 to 4, the interrupted cutting life was 4.4 km or more, and the continuous cutting life was 12 km or more. Therefore, it turned out that, when the compound sintered body includes 65 vol % or more and 75 vol % or less of cBN particles, the compound sintered body can be further prevented from being broken and further suppressed from wearing even when processing of hardened steel or the like is performed.

In each of Examples 6 to 8, the interrupted cutting life was 3 km or more. On the other hand, in each of Comparative Examples 3 and 4, the interrupted cutting life was less than 3 km. It turned out from the above-described results that, when the particle size of each cBN particle at the top point included in the first peak appearing in the second particle size distribution curve of the cBN particles is 2 μm or more and 7 μm or less, the compound sintered body can be prevented from being broken even when processing of hardened steel or the like is performed.

In each of Examples 9 to 12, the interrupted cutting life was 3 km or more. On the other hand, in each of Comparative Examples 5 and 6, the interrupted cutting life was less than 3 km. It turned out from the above-described results that, when the integral value ratio ($I_o/I_t \times 100$) is 1 or more and 20 or less, the compound sintered body can be prevented from being broken even when processing of hardened steel or the like is performed.

In each of Examples 13 to 16, the interrupted cutting life was 3 km or more, and the continuous cutting life was 9 km or more. Therefore, it turned out that, in the case where processing of hardened steel or the like is performed, the compound sintered body can be prevented from being broken and can be suppressed from wearing irrespective of the average particle size of the binder particles.

Furthermore, the interrupted cutting life was longer in Examples 13 and 14 than in Examples 15 and 16. Therefore, it turned out that, when the average particle size of the binder particles is 50 nm or more and 500 nm or less, the compound sintered body can be further prevented from being broken when processing of hardened steel or the like is performed.

In each of Examples 17 to 22, the interrupted cutting life was 3 km or more, and the continuous cutting life was 9 km or more. Therefore, it turned out that, when processing of hardened steel or the like is performed, the compound sintered body can be prevented from being broken and can be suppressed from wearing irrespective of the peak height ratio ($I_{TiB2}/I_{cBN} \times 100$).

Furthermore, the interrupted cutting life was longer in Example 17 than in Example 21. Furthermore, the continuous cutting life was longer in Example 20 than in Example 22. It turned out from the above-described results that, when the peak height ratio ($I_{TiB2}/I_{cBN} \times 100$) is 10 or more and 25 or less, the compound sintered body can be further prevented from being broken and can be further suppressed from wearing when processing of hardened steel or the like is performed.

In each of Examples 1 to 22, the peeled area of the coating layer was 7000 μm² or less, and the flank face wear amount was 80 mm or less. Therefore, it turned out that, in each case, the adhesiveness between the compound sintered body and the coating layer is high, and the cutting tool is excellent in flank face wear resistance.

Examples 23 and 34 and Comparative Examples 7 to 18

In each of Examples 23 and 34 and Comparative Examples 7 to 18, the composition of the A layer, a composition ratio s of Cr in the A layer, the thickness of the A layer, a composition ratio t of Al in the B layer, and the thickness of the B layer were changed to the values shown in Table 2. Except for the above, the cutting tool was manufactured in accordance with the method of manufacturing the cutting tool described in the above Example 3. The manufactured cutting tool was used to measure the interrupted cutting life and the continuous cutting life, and then, evaluate the peeling resistance. The results thereof are shown in Table 2.

TABLE 2

| | No. | A Layer (Al$_{1-s}$Cr$_s$N) Compositions | A Layer Thickness (μm) | B Layer (Ti$_{1-t}$Al$_t$N) Composition 1 | B Layer Thickness (μm) | Entire Thickness of Coating Layer (μm) | Peeled Area of Coating Layer (μm²) | Flank Face Wear Amount (mm) |
|---|---|---|---|---|---|---|---|---|
| Comparative Example | 7 | 0.3 | 0 | 0.5 | 1 | 1.4 | 12000 | Peeled |
| | 8 | | 0.005 | | | 1.4 | 10000 | 40 |
| Example | 23 | | 0.05 | | | 1.4 | 2000 | 40 |
| | 24 | | 0.2 | | | 1.4 | 1000 | 50 |
| | 25 | | 0.5 | | | 2 | 4000 | 70 |
| Comparative Example | 9 | | 0.7 | | | 2 | 5000 | 120 |
| | 10 | | 1 | | | 2.5 | 8000 | 130 |
| | 11 | (TiN) | 0.2 | 0.5 | 1 | 1.4 | 12000 | 170 |
| | 12 | (Ti$_{0.8}$Si$_{0.2}$N) | 0.5 | 0.5 | 1 | 2 | 14000 | 170 |
| Comparative Example | 13 | 0.1 | 0.4 | 0.7 | 1.5 | 2 | 10000 | 60 |
| Example | 26 | 0.2 | | | | | 5000 | 60 |
| | 27 | 0.3 | | | | | 3000 | 60 |
| | 28 | 0.9 | | | | | 7000 | 60 |
| Comparative Example | 14 | 1 | | | | | 10000 | 60 |
| Comparative Example | 15 | 0.4 | 0.1 | 0.1 | 1.4 | 1.7 | 1700 | 120 |
| Example | 29 | | | 0.3 | | | 1500 | 80 |
| | 30 | | | 0.5 | | | 1700 | 50 |
| | 31 | | | 0.8 | | | 1700 | 80 |
| Comparative Example | 16 | | | 0.9 | | | 1500 | 120 |
| Comparative Example | 17 | 0.35 | 0.2 | 0.6 | 0.1 | 0.3 | 1500 | 140 |
| Example | 32 | | | | 0.2 | 1 | 1200 | 130 |
| | 33 | | | | 1 | 1.5 | 1200 | 60 |
| | 34 | | | | 5 | 5.4 | 7000 | 50 |
| Comparative Example | 18 | | | | 7 | 7.4 | 14000 | Peeled |

In each of Examples 23 and 34, the interrupted cutting life was 3 km or more, and the continuous cutting life was 9 km or more. Therefore, it turned out that, when processing of hardened steel or the like is performed, the compound sintered body can be prevented from being broken and can be suppressed from wearing, irrespective of the configuration of the coating layer, the composition of the A layer, the thickness of the A layer, the composition of the B layer, and the thickness of the B layer.

The peeled area of the coating layer was smaller in Examples 23 to 25 than in Comparative Examples 7 to 10. Therefore, it turned out that the adhesiveness between the compound sintered body and the coating layer can be increased when the thickness of the A layer is 0.05 μm or more and 0.5 μm or less.

Furthermore, the peeled area of the coating layer and the flank face wear amount were smaller in Examples 23 to 25 than in Comparative Examples 11 and 12. Therefore, it turned out that, when the composition of the A layer is Al$_{1-s}$Cr$_s$N (0.2≤s≤0.9), the adhesiveness between the compound sintered body and the coating layer can be increased, and also, the flank face wear resistance of the cutting tool can be increased.

The peeled area of the coating layer was smaller in Examples 26 to 28 than in Comparative Examples 13 and 14. Therefore, it turned out that the adhesiveness between the compound sintered body and the coating layer can be increased when the composition ratio s of Cr in the A layer is 0.2 or more and 0.9 or less.

The flank face wear amount was smaller in Examples 29 to 31 than in Comparative Examples 15 and 16 Therefore, it turned out that the flank face wear resistance of the cutting tool can be increased when the composition ratio t of Al in the B layer is 0.3 or more and 0.8 or less.

In each of Examples 32 to 34, the flank face wear amount was smaller than that in Comparative Example 17, and the peeled area of the coating layer was smaller than that in Comparative Example 18. Therefore, it turned out that the flank face wear resistance of the cutting tool can be increased when the thickness of the B layer is 0.2 μm or more. Furthermore, it turned out that the adhesiveness between the compound sintered body and the coating layer can be increased when the thickness of the B layer is 5 μm or less.

In addition, peeling of the coating layer occurred in each of Comparative Examples 7 and 18.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

The invention claimed is:

1. A surface-coated boron nitride sintered body tool, in which at least a cutting edge portion includes a compound sintered body and a coating layer provided on a surface of said compound sintered body,
   said compound sintered body including cubic boron nitride particles and binder particles,
   said compound sintered body including 45 vol % or more and 80 vol % or less of said cubic boron nitride particles,
   in a case where a particle size distribution of said cubic boron nitride particles in at least one cross section of said compound sintered body is shown by a first particle size distribution curve plotted by a horizontal axis that is divided in each prescribed particle size range and a vertical axis that shows a proportion of the number of particles in each said particle size range, said first particle size distribution curve having one or more peaks in a range in which a particle size is 0.1 μm or more and 0.7 μm or less, in a case where the particle size distribution of said cubic boron nitride particles in at least one cross section of said compound sintered body is shown by a second particle size distribution curve plotted by a horizontal axis that is divided in each prescribed particle size range and a vertical axis that shows a proportion of an area occupied by particles in each said particle size range, said second particle size distribution curve having a first peak having a maximum peak height in a range in which the particle size is 2.0 μm or more and 7.0 μm or less, an integral value ratio ($I_o/I_t \times 100$) between an integral value $I_o$ and an integral value $I_t$ being 1 or more and 7 or less, in said second particle size distribution curve, said integral value $I_o$ being in the range in which the particle size is 0.1 μm or more and 0.7 μm or less, and said integral value $I_t$ being in an entire range, said coating layer including an A layer that is in contact with the surface of said compound sintered body, and a B layer provided on said A layer, said A layer being made of $Al_{1-s}Cr_sN$ (0.2≤s≤0.9), said B layer being made of $Ti_{1-t}Al_tN$ (0.3≤t≤0.8), said A layer having a thickness of 0.05 μm or more and 0.5 μm or less, said B layer having a thickness of 0.2 μm or more and 5 μm or less, and said coating layer having an entire thickness of 0.3 μm or more and 7 μm or less.

2. The surface-coated boron nitride sintered body tool according to claim 1, wherein
said compound sintered body includes 65 vol % or more and 75 vol % or less of said cubic boron nitride particles.

3. The surface-coated boron nitride sintered body tool according to claim 1, wherein
in an X-ray diffraction spectrum of said compound sintered body, a peak height ratio ($I_{TiB2}/I_{cBN} \times 100$) of a peak height $I_{TiB2}$ of a peak belonging to a (101) plane of $TiB_2$ to a peak height $I_{cBN}$ of a peak belonging to a (111) plane of said cubic boron nitride particle is 10 or more and 25 or less.

4. The surface-coated boron nitride sintered body tool according to claim 1, wherein said binder particles have an average particle size of 50 nm or more and 500 nm or less.

5. The surface-coated boron nitride sintered body tool according to claim 1, wherein
in a case where a thermal conductivity of said compound sintered body is defined as X (W/m·K) and a volume content of said cubic boron nitride particles in said compound sintered body is defined as Y (vol %), X/Y is 1.2 or more.

* * * * *